United States Patent [19]

Strautz

[11] Patent Number: 4,460,236
[45] Date of Patent: Jul. 17, 1984

[54] TEST APPARATUS FOR ELECTRICAL CIRCUIT BOARDS

[75] Inventor: Michael G. Strautz, Columbus, Ohio

[73] Assignee: AT&T Bell Laboratories, Murray Hill, N.J.

[21] Appl. No.: 331,529

[22] Filed: Dec. 17, 1981

[51] Int. Cl.³ .............................................. H01R 9/00
[52] U.S. Cl. ............................. 339/176 M; 339/17 CF
[58] Field of Search ...... 339/17 CF, 176 M, 176 MP; 174/52 FP

[56] References Cited

U.S. PATENT DOCUMENTS

| | | | |
|---|---|---|---|
| 1,718,529 | 6/1929 | Coldwell | 339/176 MP |
| 2,074,397 | 3/1937 | Israel | 339/176 M |
| 3,262,082 | 7/1966 | Gammel, Sr. | 339/176 MP |
| 3,264,601 | 8/1966 | Hartholz | 339/176 MP |
| 3,409,860 | 11/1968 | Kirby | 339/121 |
| 3,605,075 | 9/1971 | Stofkooper | 339/176 MP |
| 3,656,183 | 4/1972 | Walterscheid | 339/17 CF |
| 4,060,296 | 11/1977 | Kunkle et al. | 339/17 |
| 4,113,337 | 9/1978 | McKee | 339/176 M |
| 4,322,119 | 3/1982 | Baker | 339/17 CF |
| 4,390,224 | 6/1983 | Showman et al. | 339/176 MP |

FOREIGN PATENT DOCUMENTS 2356840 5/1974 Fed. Rep. of Germany ...... 339/176 MP
1496724 4/1967 France ........................... 339/176 M

OTHER PUBLICATIONS

IBM Bulletin, vol. 13, No. 7, Dec. 1970, "Microcircuit Module and Connector", by Franck and Hill.

Primary Examiner—John McQuade
Assistant Examiner—Gary F. Paumen
Attorney, Agent, or Firm—W. H. Kamstra; D. A. Marshall

[57] ABSTRACT

Test apparatus for testing the circuits carried by an electrical circuit board (11) through receptacles (10) for mounting electrical components such as dual inline circuit packs (DIPs) (20). The two rows of contacts (16) for receiving the terminals (19) of a DIP of a receptacle (10) are modified to extend over the top of the housing of the receptacle and downward along its sides (13, 14) to present electrical contact surfaces (21). A test plug (22) is provided which has two rows of test terminals (23) extending from an upper surface. The test terminals (23) extend through the body of the plug (22) to terminate in curved contact surfaces (25) corresponding to the contact surfaces (21) on the sides (13, 14) of the receptacle housing. A pair of skirts (26, 27) extend from the sides of the body of the plug (22) outwardly of the terminal contact surfaces (25). The test plug (22) is fitted over a receptacle so that its contact surfaces (25) make frictional contact with the receptacle contact surfaces (21) when the ends of the plug skirts (26, 27) come to rest on the circuit board (11) face. The circuits on the board (11) may thus be tested by means of the plug (22) test terminals (23) without risk of damage to the fragile contacts (16) of a receptacle (10). The width of the skirts (26, 27) is determined so that the testing may be accomplished whether or not a DIP is mounted in the receptacle.

7 Claims, 1 Drawing Figure

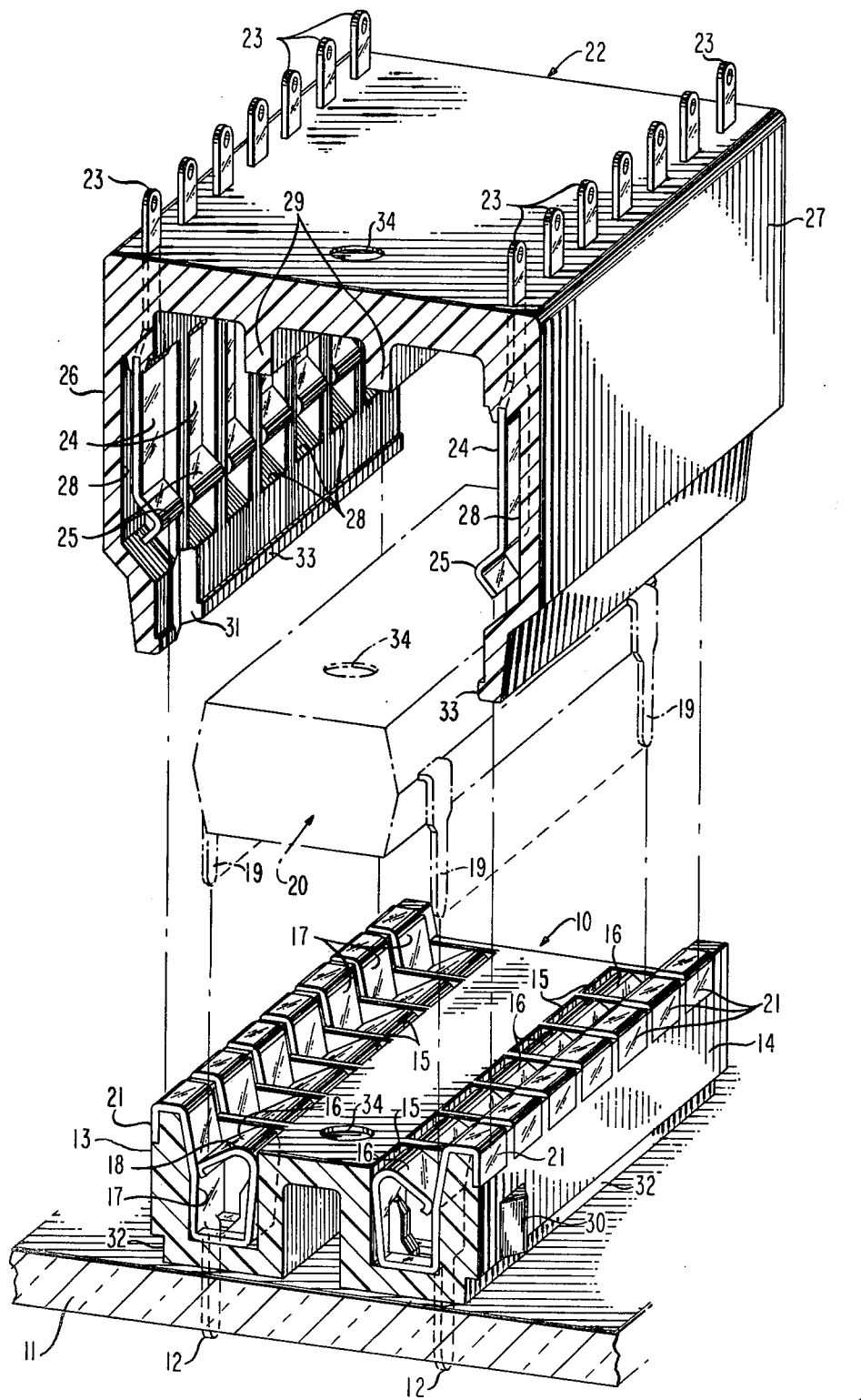

TEST APPARATUS FOR ELECTRICAL CIRCUIT BOARDS

TECHNICAL FIELD

This invention relates to electrical circuit boards and more particularly to apparatus for testing electrical components mounted on such boards.

BACKGROUND OF THE INVENTION

The mounting of dual in-line electrical circuit packs (DIPs) on an electrical circuit board by means of intermediate receptacles is well known in the electrical interconnection art. Such a receptacle is described, for example, in U.S. Pat. No. 4,060,296 of J. R. Kunkle et. al., issued Nov. 29, 1977, and comprises a rectangular housing having two rows of sockets containing terminal receiving contacts corresponding in number and position to correspond to the two rows of terminals of a DIP. The contacts extend out of the underside of the housing as terminal pins which are fitted in plated-through holes of a circuit board where the pins are soldered or otherwise secured in place. The DIP terminals are then inserted into the receptacle sockets where they are frictionally secured by the socket contacts. This DIP mounting arrangements has several advantages over the mounting of the DIP directly on the circuit board. Damage to the extremely fragile DIP terminals due to the force required to frictionally insert the terminals in the circuit board holes is avoided, for example. Also importantly, the DIP is readily removed and replaced should this become necessary.

In order to maintain the total insertion force of the DIP terminals in the receptacle sockets to a minimum, the socket contacts of necessity are also small and fragile. Any damage or misalignment of the latter contacts could in turn damage and affect the electrical contact of the DIP terminals upon their insertion in the sockets. This presents a problem when the circuits carried on the circuit board must be tested. In the past, the testing has been accomplished by first removing the DIP and then inserting a test probe or pin into the contacts of the receptacle sockets. This can, however, only be done at the considerable risk of damage to the socket contacts by overstressing and electrical contamination of the contact surfaces. It is accordingly an objective of the present invention to provide apparatus for testing the circuits of electrical circuit boards having DIP receptacles without endangering the receptacle sockets contacts.

SUMMARY OF THE INVENTION

The foregoing and other objectives of the invention are realized in one illustrative assembly in which a DIP receptacle of the general character described in the aforementioned patent of J. R. Kunkle et. al., is modified by extending a portion of the contact of each socket over the top edge of the receptacle housing and partially along the housing outer wall toward the underside to present a contact overhang. A test plug is provided having two parallel rows of test terminals extending from an upper side which terminals extend through the test plug to its underside to terminate as contact springs spaced to correspond to the spacings of the receptacle socket contact overhangs on the sides of the receptacle housing. The test plug is provided with skirts extending from its underside which are fitted about the receptacle, the skirts each having a detent at its end to latch into a cut-out in the receptacle to secure the test plug in place. The test terminals of the test plug thus permit access to the circuit board circuits without the necessity of distrubing the receptacle contacts. Advantageously, the test plug is dimensioned to be fitted over a DIP receptacle either with or without a DIP being mounted therein.

BRIEF DESCRIPTION OF THE DRAWING

The organization and operation of a test apparatus according to the principles of the invention will be better understood from a consideration of the detailed description of one illustrative embodiment thereof which follows when taken in conjunction with the accompanying drawing. The single FIGURE of the drawing shows in exploded, perspective view one illustrative test apparatus according to the invention in association with a typical dual in-line circuit pack (DIP) receptacle. The components are shown sectioned to disclose more clearly their details.

DETAILED DESCRIPTION

A typical DIP or other electrical component receptacle 10, modified according to the invention, is shown in the drawing as mounted on a portion of an electrical circuit board 11 by means of terminal pins 12 extending from the underside of the receptacle. Pins 12 are conventionally inserted in plated-through holes in board 11 where they are soldered or otherwise secured in place, the plating being electrically connected to circuitry carried by board 11. Receptacle 10 is formed of an electrically insulative material to present a generally rectangular housing having parallel side walls 13 and 14 and two parallel rows of contact sockets 15 on its upper side. Sockets 15 have electrical contacts 16 fitted therein, from which contacts terminal pins 12 extend. Contact 16 are conventionally formed to present two blades, 17 and 18, the former generally upright, the latter being bent back toward blade 17. Contacts 16 thus formed clasp the terminals 19 of a DIP 20 shown in phantom outline in the drawing when inserted in receptacle 10. In accordance with the principles of the invention, the conventional DIP receptacle so far described is modified by extending blades 17 over the upper edges of the housing of receptacle 10 and then downward toward its underside along the side 13 and 14 to present overhanging contact surfaces 21 lying flush with the surfaces of sides 13 and 14.

In accordance with the principles of the invention, a test plug 22 formed of any suitable electrically insulative material is provided, which presents two parallel rows of electrical test terminals 23 extending from an upper surface thereof. Terminals 23 extend through the body of test plug 22 and are formed to present two rows of contact springs 24 extending downward from the underside of plug 22. Springs 24 are formed to present inwardly directed curved contact surfaces 25 at their extremities. Rectangular plug 22 is formed to present at either side outwardly from springs 24, a pair of side skirts 26 and 27. On their inner surfaces skirts 26 and 27 are formed to present cavities 28 dimensioned to accommodate springs 24 to provide for their electrical isolation. A pair of ribs 29 may be formed on the undersides of the body of plug 22 to provide rigidity. The test plug 22 of the invention and its details so far described are dimensioned so that skirts 26 and 27 may be fitted over and about a receptacle 10, the curved contact surfaces 25 of springs 24 making respective electrical spring contact with the overhanging contact surfaces 21 when the lower edges of skirts 26 and 27 rest on the face of circuit board 11. Receptacle 10 may be further modified to provide a key 30 on either side formed to engage a key-way 31 formed in the inner surface of each of the skirts 26 and 27 to ensure alignment of the contact surfaces 25 and overhanging contact surfaces 21. A final modification of receptacle 10 is a pair of rectangular cut-outs 32 along the lower edges of its housing dimensioned to receive a pair of detents 33 extending inwardly along the lower edges of skirts 26 and 27. Detents 33 run uninterruptedly along the edges of skirts 26 and 27 except for keyways 31 and flex the latter skirts slightly apart as plug 22 is fitted over receptacle 10. When fully so fitted, detents 33 snap in place in cut-outs 32 to secure plug 22 in place. To ensure that the components shown in the drawing are correctly mated, conventional indicia 34 may be formed in a visible surface of each. Advantageously, the width of skirts 26 and 27 is so determined that test plug 22 may be fitted over a receptacle 10 whether or not a DIP 20 is mounted thereon. When fitted over a receptacle 10, the circuits of circuit board 11 may be tested by means of test terminals 23 without disturbing the fragile contacts 16 of receptacle 10. Test plug 22 is readily removed by slightly spreading apart skirts 26 and 27 to free detents 33.

What has been described is considered only one specific illustrative test apparatus according to the invention. Accordingly, it is to be understood that various and numerous other arrangements may be devised by one skilled in the art without departing from the spirit and scope of the invention as limited only by the accompanying claims.

What is claimed is:

1. An electrical circuit test assembly comprising an electrical component receptacle having a plurality of electrical contacts each with a pair of blades adapted to receive and clasp one of a corresponding plurality of terminals of said component, said receptacle having a pair of opposite side walls presenting outer surfaces of said receptacle, each of said contacts having one of said blades formed as an extension presenting an external contact surface extending over an upper portion and downward flush against an outer surface of one of said side walls and a test plug comprising a body having an upper surface and having a pair of skirts extending substantially at right angles in the same direction from said upper surface, said skirts being being spaced apart to fit over said receptable along said side walls, and a plurality of test terminals extending from said upper surface of said body, each of said test terminals terminating in a contact spring on an undersurface of said body within said pair of skirts, said contact springs being spaced to engage and make electrical contact with respective contact surfaces positioned flush against one of said side walls when said skirts are fitted over said receptacle.

2. An electrical circuit test assembly as claimed in claim 1 in which said side walls each has a notch formed therein along a lower edge, and in which said skirts each has a detent formed along its lower edge adapted to engage a notch of one of said side walls as said skirts are fitted over said receptacle.

3. An electrical circuit test assembly comprising an electrical component receptacle having first and second rows of electrical contacts each with a pair of blades adapted to receive and clasp one terminal of corresponding first and second rows of terminals of said components, said receptacle having a pair of opposite side walls presenting outer surfaces of said receptacle, the contacts of each of said rows having one of said blades formed as an extension presenting an external contact surface extending over an upper portion an downward flush against an outer surface of each of said side walls, and a test plug comprising a rectangular body having an upper surface and having a pair of skirts extending at the sides substantially at right angles in the same direction from said upper surface, said skirts being spaced apart to fit over said receptacle along said side walls, and a first and second plurality of test terminals extending from said upper surface of said body, said test terminals terminating in a first and second row of contact springs extending from an under surface of said body within said pair of skirts, said first and second row of springs being spaced to engage and make electrical contact with respective contact surfaces positioned flush against said side walls when said skirts are fitted over said receptacle.

4. An electrical circuit test assembly as claimed in claim 3 in which said side walls of said receptacle each has a notch formed therein along a lower edge, and in which said skirts each has a detent formed along a lower edge adapted to engage a notch of one of said side walls as said skirts are fitted over said receptacle.

5. Electrical test apparatus for an electrical component mounting receptacle having a plurality of contacts each with a pair of blades for receiving and clasping the terminals of an electrical component, said receptacle having a pair of opposite side walls presenting outer surfaces of said receptacle, said contacts having ones of said blades formed as extensions forming a plurality of external contact surfaces extending over an upper portion and downward flush against an outer surface of one of said side walls, said apparatus comprising a substantially rectangular body having a pair of shirts extending from opposite sides thereof to present a substantially "U"-shaped cross-section, said skirts being spaced apart to fit over said receptacle, and a plurality of test terminals extending from an upper side of said body, said terminals extending through said body to terminate in a plurality of contract springs extending from an underside of said body within said pair of skirts, said contact springs being spaced to contact said external contact surfaces positioned flush against said receptacle side walls as said apparatus and said skirts are fitted over said receptacle.

6. Electrical test apparatus as claimed in claim 5 in which said skirts have inwardly directed detents formed along the outer edges thereof, said detents being adapted to engage notches formed along the lower edges of said side walls when said notches are formed on said receptacle.

7. Electrical test apparatus for an electrical component mounting receptacle having a first and second row of contacts each with a pair of blades for receiving and clasping the terminals of an electrical component, said rows of contacts lying inwardly from opposite side walls of said receptacle, said side walls presenting outer surfaces of said receptacle, said contacts of each of said rows having ones of said blades formed as extensions forming external contact surfaces extending over the upper portions and downward flush against said outer surfaces of said side walls, said side walls having notches formed therein along the lower edges thereof, said apparatus comprising a subtantially rectangular body having a pair of skirts extending from opposite sides thereof to present a substantially "U"-shaped cross-section, said skirts having, respectively, a pair of inwardly directed detents extending along lower edges thereof, said skirts being spaced apart to fit over said receptacle, and a first and second plurality of test terminals extending from an outer side of said body, said terminals extending through said body to terminate in a first and second row of contact springs extending from an inner side of said body within said pair of skirts, said contact springs being spaced to contact said external contact surfaces positioned flush against said side walls of said receptacle and said detents being adapted to engage said notches in said side walls as said apparatus and said skirts are fitted over said receptacle.

* * * * *